United States Patent [19]
Jon et al.

[11] Patent Number: 6,103,016
[45] Date of Patent: Aug. 15, 2000

[54] MITIGATION OF ELECTROSTATIC DISCHARGES DURING CARBON DIOXIDE CLEANING

[75] Inventors: Min-Chung Jon, Princeton Junction, N.J.; Hugh Nicholl, Berthoud, Colo.; Peter Hartpence Read, Morrisville, Pa.

[73] Assignee: Lucent Technologies Inc., Murray Hill, N.J.

[21] Appl. No.: 08/562,619

[22] Filed: Nov. 28, 1995

Related U.S. Application Data

[63] Continuation of application No. 08/349,275, Dec. 5, 1994, abandoned.

[51] Int. Cl.[7] ................................................ C03C 23/00
[52] U.S. Cl. .................... 134/2; 134/4; 134/6; 134/7; 134/8; 134/18; 134/27; 134/28; 134/33
[58] Field of Search .................... 134/2, 4, 7, 8, 134/27, 6, 28, 33, 18

[56] References Cited

U.S. PATENT DOCUMENTS

| | | | |
|---|---|---|---|
| 4,535,576 | 8/1985 | Shukla et al. ........................ | 51/413 |
| 5,081,068 | 1/1992 | Endo et al. .......................... | 437/225 |
| 5,147,466 | 9/1992 | Ohmori et al. ...................... | 134/7 |
| 5,288,332 | 2/1994 | Pustilnik et al. .................... | 134/27 |
| 5,354,384 | 10/1994 | Sneed et al. ....................... | 134/6 |
| 5,409,418 | 4/1995 | Krone-Schmidt et al. .......... | 451/75 |

OTHER PUBLICATIONS

G. Carter, "Streaming Potential ESD Shifts during Post Dicing High Pressure Spray Rinse Operations," 1991 EOS/ESD Symposium Proceedings, pp. 50–58.

*Primary Examiner*—Jill Warden
*Assistant Examiner*—Sharidan Carrillo
*Attorney, Agent, or Firm*—Robert B. Levy

[57] ABSTRACT

Electrostatic discharges that occur during solid $CO_2$ cleaning of a substrate (10) can be virtually eliminated by chilling the substrate so that moisture in the atmosphere, in the form of water droplets (30), condense on the substrate surface (14), thereby forming a continuous film of water (28). The water in the film (28) reacts with the solid $CO_2$ (24) to form carbonic acid that dissociates into free ions that neutralize the charge on the solid $CO_2$.

4 Claims, 1 Drawing Sheet

6,103,016

MITIGATION OF ELECTROSTATIC DISCHARGES DURING CARBON DIOXIDE CLEANING

This application is a continuation of application Ser. No. 08/349,275, filed on Dec. 5, 1994 now abandoned.

TECHNICAL FIELD

This invention relates to a method of reducing the incidence of electrostatic discharges during solid carbon dioxide cleaning of a component-carrying substrate.

BACKGROUND ART

Electronic component-carrying substrates (e.g., circuit boards) are commonly cleaned to remove solder flux residues that result from soldering components to the substrate. Traditionally, component-carrying substrates have been cleaned by solvent spraying or solvent immersion. While solvent cleaning effectively removes solder flux and other undesirable residues, the advent of stringent environmental regulations has made solvent cleaning more difficult and costly to implement. For that reason, much effort is being devoted to developing solvent-free cleaning techniques. One approach for accomplishing solvent-free cleaning of component-carrying circuit substrates has been to direct solid $CO_2$ pellets at the substrate at a high velocity. Although the exact mechanism by which such pellets clean the substrate is not completely understood, it is believed that upon striking the substrate, the $CO_2$ pellets act to abrade the residues and carry them from the substrate.

One disadvantage of cleaning a component-carrying substrate in this fashion is that the $CO_2$ pellets strike the substrate and tribocharge (electrify by contact and separation) the substrate, including its insulative and conductive portions. In some instances, the resultant charge on the pellets and/or the substrate may be sufficient to damage or destroy the electronic components on the substrate. We have discovered that in order to effectively mitigate electrostatic discharges, a water film must be produced on the substrate surface. The film of water is needed so that the water can combine with the $CO_2$ to produce carbonic acid ($H_2CO_3$) that dissociates into free ions that neutralize the charge on the $CO_2$ pellets and the substrate (including the insulative and conductive portions thereof). In practice, we have found that spraying a water mist on the substrate during solid $CO_2$ cleaning greatly reduces the incidence of electrostatic discharges. However, the incidence of electrostatic discharges was not completely eliminated because the sprayed water mist did not uniformly adhere to the substrate but tended to form puddles instead.

Thus, there is a need for a technique for eliminating virtually all electrostatic discharges associated with cleaning an electronic-carrying substrate with solid $CO_2$.

BRIEF SUMMARY OF THE INVENTION

Briefly, a technique is provided for virtually mitigating all electrostatic discharges that occur when solid $CO_2$ particles (e.g., pellets) are directed at an electronic component-carrying substrate for cleaning purposes. In accordance with the invention, electrostatic discharges are effectively eliminated by chilling the substrate so that moisture in the atmosphere condenses on the substrate surface. The condensation process consists both of nucleation and growth of water molecules which create a nearly continuous film of water that adheres well to the substrate surface. The water film reacts with the $CO_2$ to yield a substantially continuous film of carbonic acid that dissociates to yield free ions that nearly completely neutralize the charge on the $CO_2$ particles and on the substrate. The water film formed by the condensed moisture is more uniform than water films obtained by mechanical means such as spraying, thereby achieving virtually complete mitigation of electrostatic discharges.

DETAILED DESCRIPTION

Figure 1:
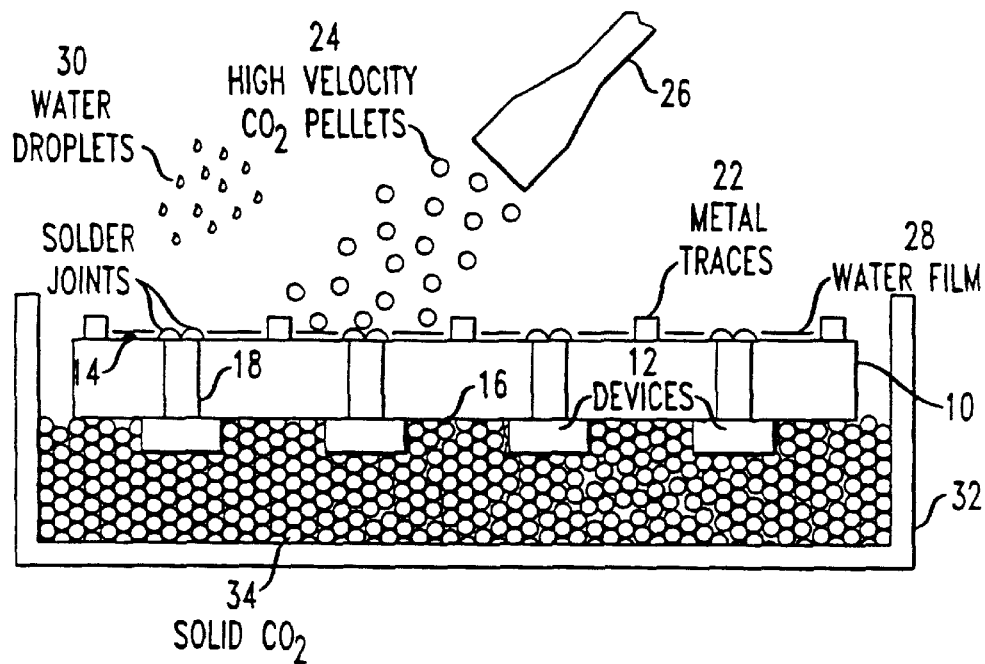
FIG. 1 is a side view of an electronic-component carrying substrate undergoing solid $CO_2$ cleaning in accordance with a first aspect of the invention.

FIG. 1 shows a conventional substrate 10 (e.g., a printed circuit board) that carries a plurality of electronic devices (e.g., active or passive components) 12 on one or both of its two opposed major surfaces 14 and 16. (In the illustrated embodiment, only the surface 16 carries the electronic devices 12). Each device 12 has at least one lead 18 soldered to a metallized area (not shown) on one of the substrate surfaces 14 and 16 to yield a solder joint 20 that is connected with one or more other solder joints via one or more metal traces 22. In the illustrated embodiment, the devices 12 comprise through-hole devices whose leads 14 extend that through apertures (not shown) in the substrate 10 so that each lead continues slightly beyond the substrate major surface 14 opposite the surface 16 that carries the component. It should be understood that one or more of the devices 12 may be surface mount devices whose leads are soldered to the same substrate surface that supports the component.

During the process of soldering the leads 14 to form the solder joints 20 on the substrate surface 14, residues often result, particularly if the substrate surface was fluxed prior to soldering. For cosmetic reasons, as well as to assure good testability and to prevent possible corrosion in the future, it is desirable to clean the solder joints 20 and the traces 22 on the surface 14. Solid $CO_2$ cleaning is one method of cleaning the substrate 10 that does not require the use of solvents, and thus does not suffer from many of the constraints imposed by the use of solvents for cleaning purposes. In general, solid $CO_2$ cleaning is accomplished by generating $CO_2$ pellets 24, via a generator 26, and then directing such pellets at a high velocity against one or both of the surfaces 14 and 16. (In the illustrated embodiment, only the surface 14 is struck by the pellets 14.) While the mechanism by which such pellets 24 clean is not completely understood, it is believed that such pellets transfer their kinetic energy to the substrate surface, thereby abrading the residues. Also, some heat may be transferred from the pellets 24, possibly rendering the flux residues brittle so as to be driven off by subsequent pellets.

One drawback that has heretofore impeded widespread adoption of solid $CO_2$ cleaning of the substrate 10 has been the occurrence of electrostatic discharges during cleaning. The solid $CO_2$ pellets 24 discharged from the generator 26 usually carry with them a large electrical charge that may further tribocharge the solder joints 20 and the traces 22, as well as the substrate 10. The result is to create a large body of charge of different potential, thereby significantly increasing the chance of creating electrostatic discharges. Such discharges can damage or destroy the devices 12.

Upon extensive study, we found that electrostatic discharges occurring during solid $CO_2$ cleaning can be mitigated by providing a water film 28 on the surface being cleaned (e.g., the surface 14 in FIG. 1). The water in the film 28 combines with the $CO_2$ in the pellets 24 to create carbonic acid ($H_2CO_3$) that dissociates into free ions that neutralize the static charges. We further found that when the water film 28 was formed by mechanically spraying water on the surface 14, the electrostatic discharges were greatly reduced, but not completely eliminated. Although the reason why the electrostatic discharges were not completely eliminated is not fully understood, it is believed that the water film 28 formed by spraying did not adhere well to the surface 14, leaving regions In accordance with the invention, we found that by forming a continuous water film 28 on the surface 14, electrostatic discharges could be virtually eliminated. Such a continuous film affords a nearly uniform distribution of free ions resulting from the dissociation of the carbonic acid formed as the water reacts with the $CO_2$ pellets 24. The free ions so formed combine with the charges created upon impact by the $CO_2$ pellets to leave a zero net charge on the substrate. Further, we found that the best way to form the continuous water film 28 was to chill the substrate 10 so that moisture (depicted as water droplets 30) in the atmosphere adjacent to the surface being cleaned (e.g., surface 14) becomes saturated (i.e., reaches its dew point) and thereby condenses on the surface. The condensation process generally consists of nucleation and growth of water molecules which has been found to achieve a nearly continuous film 28 that adheres well to the surface 14.

As illustrated in FIG. 1, the substrate 10 can be chilled to achieve saturation of the moisture in the atmosphere adjacent to the surface 14 by placing the substrate in a tub or enclosure 32 filled with solid $CO_2$ 34, typically in the form of pellets or chunks. The solid $CO_2$ 34 will effectively remove heat from the substrate 10 without damage thereto. Unlike ice, the solid $CO_2$ 34 will not melt. Moreover, the solid $CO_2$ 34 needed to fill the enclosure 32 can readily be obtained from the $CO_2$ generator 26.

Figure 2:
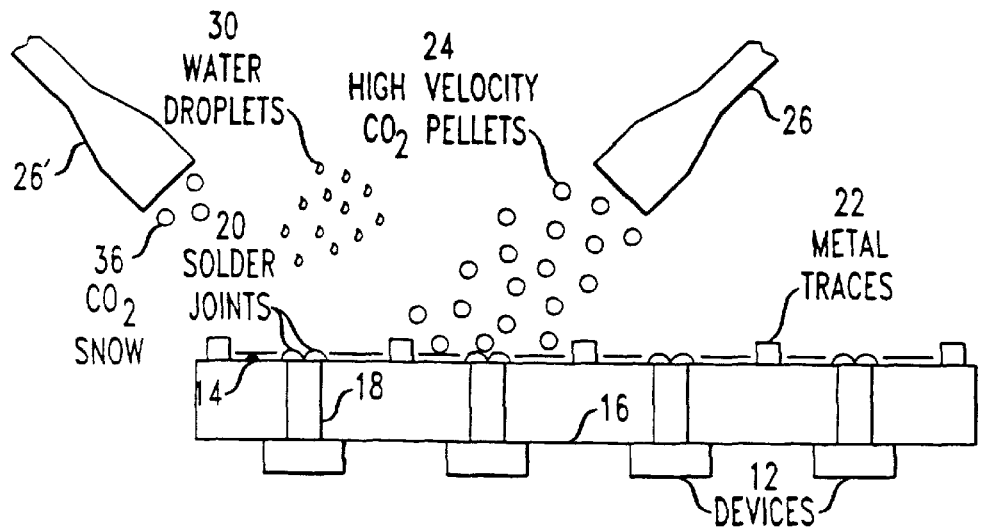
FIG. 2 is a side view of an electronic component-carrying substrate, of the type shown in FIG. 1, undergoing solid $CO_2$ cleaning in accordance with a second aspect of the invention.

Another approach to chilling the substrate 10 would be to direct solid $CO_2$ 36, in the form of snow, against the surface 14, as seen in FIG. 2, in advance of directing the pellets 24 against the surface. In practice, the $CO_2$ snow 36 could be generated by a second $CO_2$ generator 26' similar in construction to the generator 26 of FIG. 1. Directing the $CO_2$ snow 36 against the surface 14 of the substrate 10 will reduce the temperature of the substrate surface, causing the water droplets 30 in the atmosphere to condense on the substrate surface in the same manner as that described with respect to FIG. 1.

The foregoing discloses a method for mitigating electrostatic discharges occurring during solid $CO_2$ cleaning of the substrate 10 by chilling the substrate to cause moisture (water droplets 30) to condense and form a nearly continuous water film on the substrate surface. The water film reacts with the $CO_2$ to create carbonic acid that dissociates to create free ions that neutralize the charge on the solid $CO_2$, thereby mitigating virtually all electrostatic discharges. While the substrate may be chilled by the placing it in an enclosure 32 filled with solid $CO_2$, or by directing $CO_2$ snow 36 at the substrate, such chilling may be accomplished in other ways. For example, the substrate could be chilled by placing it in a refrigerator or by directing a chilled gas (e.g., air or nitrogen) at the substrate. thereto by those skilled in the art which will embody the principles of the invention and fall within the spirit and scope thereof.

What is claimed is:

1. A method of mitigating electrostatic discharges occurring during cleaning of a substrate when solid $CO_2$ particles are directed against a major surface of the substrate wherein the improvement comprises the steps of:

placing the substrate a moisture-containing atmosphere; and chilling the substrate prior to directing the solid $CO_2$ particles thereat to cause moisture in the moisture-containing atmosphere to condense on the major surface of the substrate to form a substantially continuous film of water directing the solid $CO_2$ particles against the major surface of the substrate, reacting the $CO_2$ particles with the water film to form carbonic acid ($H_2CO_3$), wherein said carbonic acid dissociates into free ions that neutralize the electrostatic charges on the solid $CO_2$ particles.

2. The method according to claim 1 wherein the substrate is chilled by placement within an enclosure containing solid $CO_2$.

3. The method according to claim 1 wherein the substrate is chilled by directing a chilled gas at said substrate.

4. The method according to claim 1 wherein the substrate is chilled by refrigerating said substrate.

* * * * *